United States Patent
Tokairin

(10) Patent No.: US 10,263,625 B1
(45) Date of Patent: Apr. 16, 2019

(54) TDC CIRCUIT AND PLL CIRCUIT

(71) Applicants: KABUSHIKI KAISHA TOSHIBA, Minato-ku, Tokyo (JP); TOSHIBA ELECTRONIC DEVICES & STORAGE CORPORATION, Minato-ku, Tokyo (JP)

(72) Inventor: Takashi Tokairin, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/113,097

(22) Filed: Aug. 27, 2018

(30) Foreign Application Priority Data

Mar. 13, 2018 (JP) .................................. 2018-045384

(51) Int. Cl.
| | |
|---|---|
| H03L 7/06 | (2006.01) |
| H03H 11/26 | (2006.01) |
| H03L 7/093 | (2006.01) |
| G04F 10/00 | (2006.01) |
| H03L 7/099 | (2006.01) |

(52) U.S. Cl.
CPC ............ *H03L 7/093* (2013.01); *G04F 10/005* (2013.01); *H03L 7/0992* (2013.01)

(58) Field of Classification Search
CPC combination set(s) only.
See application file for complete search history.

(56) References Cited

U.S. PATENT DOCUMENTS

| | | | |
|---|---|---|---|
| 7,940,099 B2 | 5/2011 | Weltin-Wu et al. | |
| 8,174,293 B2 * | 5/2012 | Yoshihara | G04F 10/005 327/107 |
| 8,736,327 B2 | 5/2014 | Matsuda | |
| 10,007,235 B2 * | 6/2018 | Wang | G04F 10/005 |

FOREIGN PATENT DOCUMENTS

| | | |
|---|---|---|
| JP | 2010021686 A | 1/2010 |
| JP | 2013077869 A | 4/2013 |
| JP | 5397471 B2 | 1/2014 |

OTHER PUBLICATIONS

Enrico Temporiti, et al., "A 3.5 GHz Wideband ADPLL With Fractional Spur Suppression Through TDC Dithering and Feedforward Compensation," IEEE Journal of Solid-State Circuits, vol. 45, No. 12, Dec. 2010, pp. 2723-2736.

\* cited by examiner

*Primary Examiner* — An T Luu
(74) *Attorney, Agent, or Firm* — Holtz, Holtz & Volek PC

(57) ABSTRACT

A TDC circuit includes a plurality of delay elements connected in series. The TDC circuit includes a reference signal supply circuit that randomly selects one of the plurality of delay elements to supply a reference signal. The TDC circuit includes a plurality of latch circuits that latch a clock signal in response to outputs of the plurality of delay elements. The TDC circuit includes an output circuit that codes output signals output from the plurality of latch circuits and outputs a digital code indicating a relative time relationship of the clock signal with respect to the reference signal.

20 Claims, 5 Drawing Sheets

US 10,263,625 B1

TDC CIRCUIT AND PLL CIRCUIT

CROSS-REFERENCE TO RELATED APPLICATIONS

This application is based upon and claims the benefit of priority from Japanese Patent Application No. 2018-45384, filed on Mar. 13, 2018; the entire contents of which are incorporated herein by reference.

FIELD

Embodiments described herein relate generally to a Time To Digital Converter (TDC) circuit and a Phase Locked Loop (PLL) circuit.

BACKGROUND

Nonlinearity of a TDC circuit arises due to variations in a delay time of a delay element. In the related art, a technique is disclosed where, in order to reduce a spurious caused in an output of a PLL circuit due to a periodical deviation of a phase difference due to the nonlinearity of the TDC circuit, an amount of delay of the delay element that supplies a reference signal to the TDC circuit is controlled, an operation is performed by using a phase difference based on a phase difference error with respect to each delay amount prepared in advance in a lookup table and an actual delay amount, and calibration is performed during a phase calculation.

The delay amount of the delay element also varies depending on manufacturing conditions of a semiconductor device (not illustrated) in which the TDC circuit and the PLL circuit are incorporated or a temperature change during operation. Control of the delay amount gives an error component to the phase difference calculation. Therefore, it is desirable that the spurious can be reduced by controlling the delay amount, the given error component can be easily grasped, and the error component can be timely corrected at the time of phase calculation.

DETAILED DESCRIPTION

According to the present embodiment, a TDC circuit includes a plurality of delay elements connected in series. The TDC circuit includes a reference signal supply circuit that randomly selects one of the plurality of delay elements to supply a reference signal. The TDC circuit includes a plurality of latch circuits that latch a clock signal in response to outputs of the plurality of delay elements. The TDC circuit includes an output circuit that codes output signals output from the plurality of latch circuits and outputs a digital code indicating a relative time relationship of the clock signal with respect to the reference signal.

Hereinafter, a TDC circuit and a PLL circuit according to embodiments will be described in detail with reference to the accompanying drawings. The present invention is not limited to the following embodiments.

First Embodiment

Figure 1:
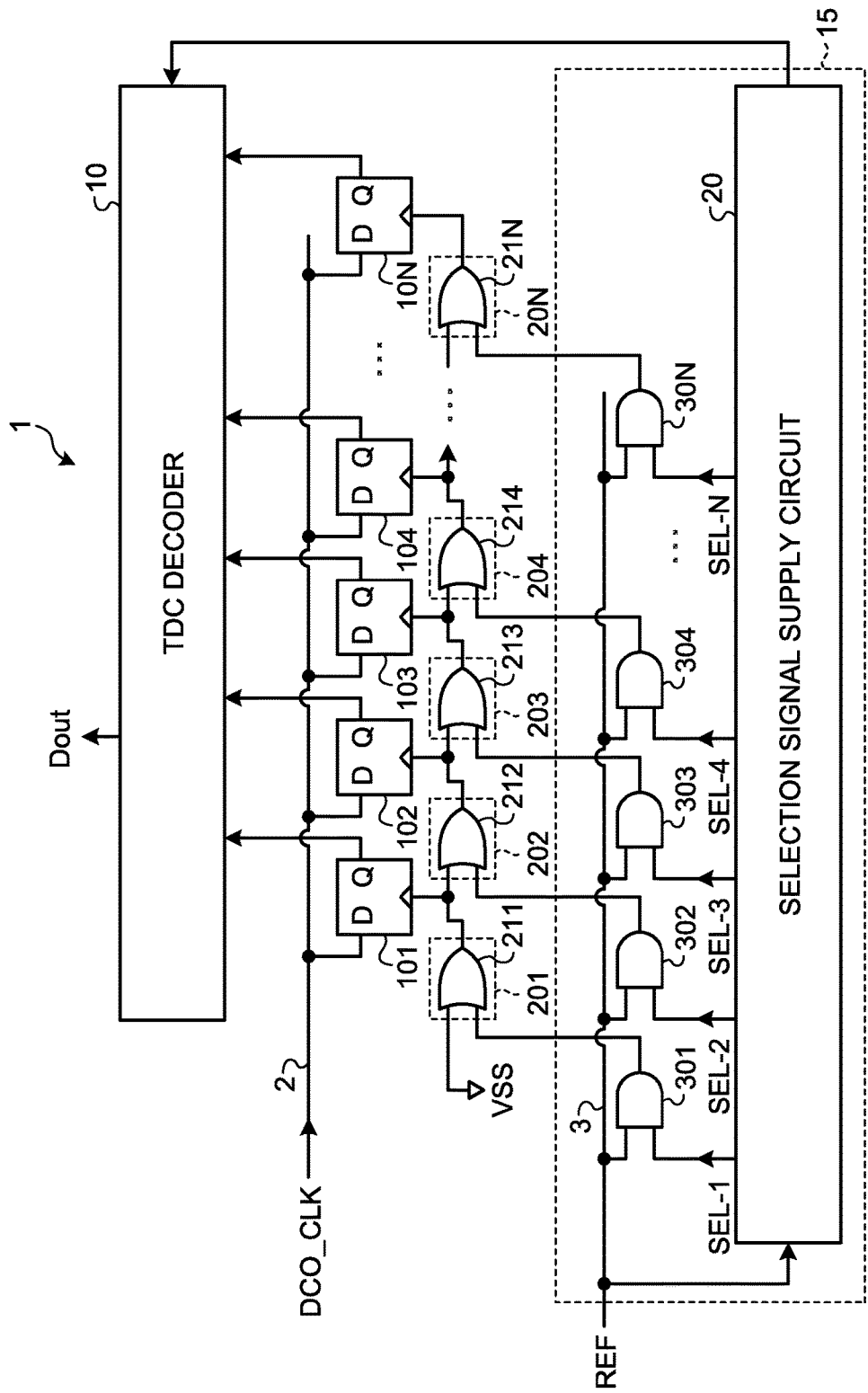
FIG. 1 is a diagram illustrating a configuration of a TDC circuit according to a first embodiment.

FIG. 1 is a diagram illustrating a configuration of a TDC circuit according to a first embodiment. A TDC circuit 1 of the present embodiment includes a TDC decoder 10, delay elements 201 to 20N (N: an integer of 2 or more), a reference signal supply circuit 15, and D-type latch circuits 101 to 10N.

The delay elements 201 to 20N are connected in series and are constituted by OR circuits 211 to 21N. An output signal of each OR circuit is supplied to one input terminal of the OR circuit of the subsequent stage. A ground potential VSS is supplied to one input terminal of the OR circuit 211 of the first stage. The ground potential VSS corresponds to a logical level "0" of the OR circuit 211. A reference signal REF is selectively supplied from the reference signal supply circuit 15 to the other input terminals of the OR circuits 211 to 21N.

The reference signal supply circuit 15 includes a selection signal supply circuit 20 and a plurality of AND circuits 301 to 30N provided corresponding to the respective delay elements 201 to 20N. Output signals of AND circuits 301 to 30N are supplied to OR circuits 211 to 21N, respectively. A reference signal REF is supplied from a signal line 3 to one input terminal of each of the AND circuits 301 to 30N.

A reference signal REF is supplied to the selection signal supply circuit 20. The selection signal supply circuit 20 supplies selection signals SEL-1 to SEL-N to the other input terminals of the AND circuits 301 to 30N in response to the reference signal REF.

One of the AND circuits 301 to 30N is randomly selected by the selection signals SEL-1 to SEL-N. The reference signal REF is supplied from the selected AND circuit to the corresponding delay elements 201 to 20N. That is, the reference signal supply circuit 15 randomly selects any one of the delay elements 201 to 20N and supplies the reference signal REF.

The D-type latch circuits 101 to 10N latch a clock signal DCO_CLK of a Digitally Controlled Oscillator (DCO) (not illustrated) supplied from the signal line 2 at the edge timings of the output signals of the delay elements 201 to 20N, and supply the latched clock signal DCO_CLK from output terminals Q to the TDC decoder 10.

Information of the selection signals SEL-1 to SEL-N is supplied from the selection signal supply circuit 20 to the TDC decoder 10. In other words, information indicating which of the delay elements 201 to 20N is supplied with the reference signal REF is supplied to the TDC decoder 10.

The TDC decoder 10 performs a coding using the output signals of the D-type latch circuits 101 to 10N, and calculates a phase difference from the relative time relationship of the clock signal DCO_CLK with respect to the edge timing of the reference signal REF. In this calculation, a correction is performed based on the selection signals SEL-1 to SEL-N indicating which of delay elements 201 to 20N is supplied with the reference signal REF to output a digital code signal Dout.

For example, it is assumed that the number of the delay elements corresponding to a period T of the clock signal DCO_CLK is ten. When the delay element to which the reference signal REF is applied is shifted by one stage, information indicating that an error of a time corresponding to 1/10 of the period T is given is supplied to the TDC decoder 10. The TDC decoder 10 outputs a correction signal based on the information, that is, subtracts the error component to output a digital code signal Dout. The number of delay elements corresponding to the period T may be grasped by the number of logic levels "1" and "0" from the D-type latch circuits 101 to 10N corresponding to the period T.

The number of stages of the delay elements 201 to 20N may be appropriately set according to the period T of the clock signal DCO_CLK and the delay time of the delay element. For example, when the period T corresponds to the delay time corresponding to ten stages in the delay elements 201 to 20N, ten further stages of delay elements can be provided in series to the subsequent stage of the delay element of the last stage randomly selected by the selection signal supply circuit 20.

Further, there is no need to adopt a configuration in which all of the delay elements 201 to 20N are randomly selected. For example, the ground potential VSS corresponding to the logic level "0" instead of the reference signal REF may be applied to the delay element 20N on the subsequent stage, and the delay element 20N may be operated in response to the output signal from the delay element of the preceding stage.

In the period T, by randomly selecting the delay element to be supplied with the reference signal REF for the first time, it is possible to avoid a periodic occurrence of non-linearity of the TDC circuit 1 and to suppress a spurious.

Correction may be performed during calculation of the phase difference between the reference signal REF and the clock signal DCO_CLK. Therefore, it is not necessary to separately perform a calibration based on a lookup table or the like.

Figure 2:
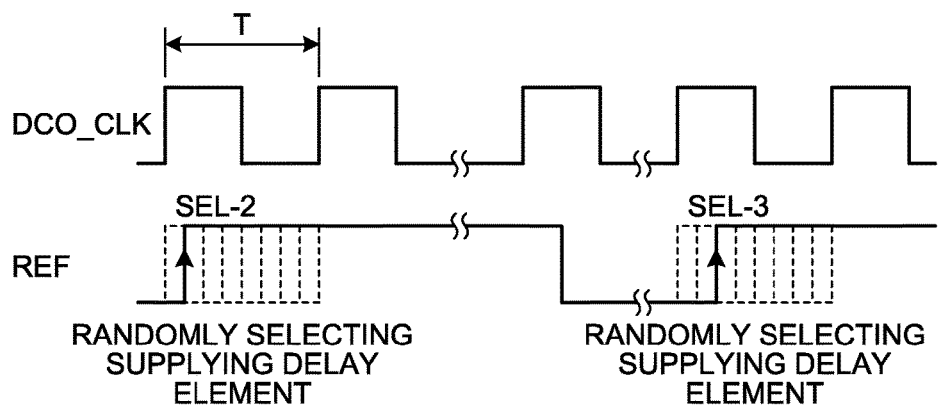
FIG. 2 is a diagram for describing a control method of the TDC circuit of the first embodiment.

FIG. 2 is a diagram for describing a control method of the TDC circuit 1. The upper stage illustrates the clock signal DCO_CLK and the lower stage illustrates the reference signal REF. In the phase comparison operation in the period T of the clock signal DCO_CLK, the delay element that supplies the reference signal REF is randomly selected by the selection signal supply circuit 20.

For example, FIG. 2 illustrates a case where an AND circuit 302 is selected by the selection signal SEL-2. The delay element 202 is selected by selecting the AND circuit 302, the clock signal DCO_CLK is latched by the D-type latch circuit 102 and supplied to the TDC decoder 10. Thereafter, the output signal of the delay element 202 is sequentially delayed by the delay elements 203 to 20N of the subsequent stage, and the outputs of the D-type latch circuits 103 to 10N are supplied to the TDC decoder 10.

In the TDC decoder 10, coding is performed using the output signals of the respective D-type latch circuits 101 to 10N and the information from the reference signal supply circuit 15, and an operation for calculating the phase difference based on the reference signal REF and the clock signal DCO_CLK is performed.

Figure 3:
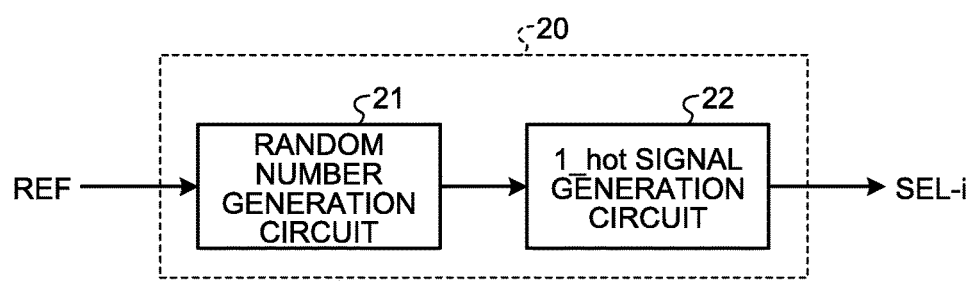
FIG. 3 is a diagram illustrating a configuration example of a selection signal supply circuit.

FIG. 3 is a diagram illustrating a configuration example of the selection signal supply circuit 20. The selection signal supply circuit 20 includes a random number generation circuit 21 and a 1_hot signal generation circuit 22. The random number generation circuit 21 outputs a random number in response to a leading timing of the reference signal REF. The 1_hot signal generation circuit 22 outputs the selection signal SEL-i in accordance with the random number output of the random number generation circuit 21. For example, when the random number output is "3," the 1_hot signal generation circuit 22 generates a signal that sets the selection signal SEL-3 corresponding to "011" to the logical level "1" and supplies the signal to the AND circuit 303. That is, the 1_hot signal generation circuit 22 outputs a signal that sets only one signal corresponding to the random number output of the random number generation circuit 21 to the logic level "1." As a result, the delay element 203 is selected. That is, for each cycle of the reference signal REF, the delay elements 201 to 20N for supplying the reference signal REF are randomly selected.

Second Embodiment

Figure 4:
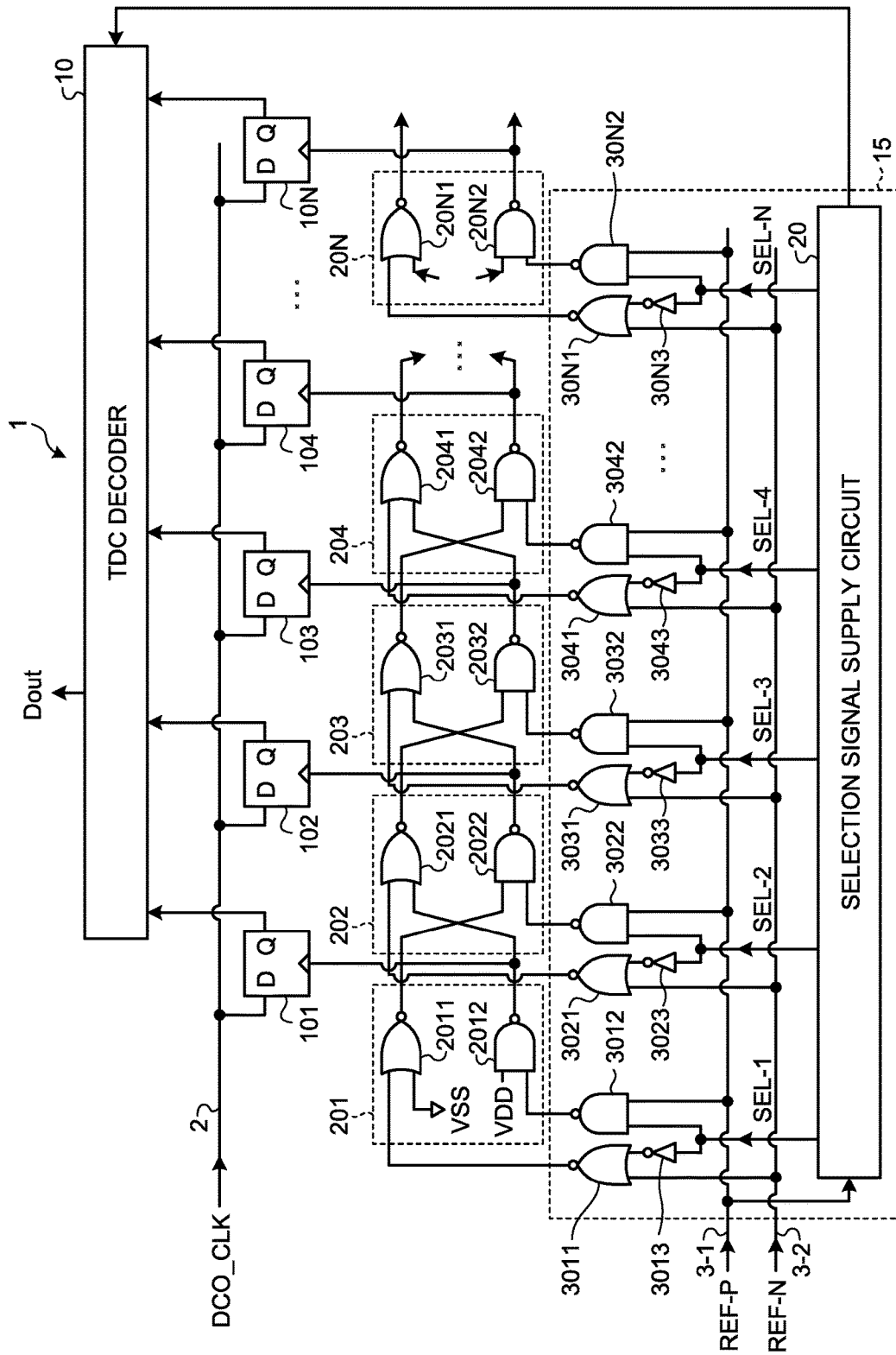
FIG. 4 is a diagram illustrating a configuration of a TDC circuit of a second embodiment.

FIG. 4 is a diagram illustrating a configuration of the TDC circuit 1 of the second embodiment. Configurations corresponding to the above-described embodiments are given the same numbers, and redundant descriptions are given only when necessary. The delay elements 201 to 20N of the present embodiment are constituted by NOR circuits 2011 to 20N1 and NAND circuits 2012 to 20N2.

The ground potential VSS corresponding to the logic level "0" is supplied to one input terminal of the NOR circuit 2011. A power supply voltage VDD corresponding to the logic level "1" is supplied to one input terminal of the NAND circuit 2012.

The OR circuit generally includes a configuration in which the output of the NOR circuit is inverted by an inverter circuit (not illustrated). Therefore, when each of the delay elements 201 to 20N is constituted by the OR circuit, the delay time of each of the delay elements 201 to 20N becomes long.

In the present embodiment, the delay elements 201 to 20N include the NOR circuits 2011 to 20N1 and the NAND circuits 2012 to 20N2. As a result, the delay time of each of the delay elements 201 to 20N can be shortened as compared with the configuration constituted by the OR circuits. Furthermore, a resolution of the TDC circuit 1 can be increased.

In the present embodiment, the reference signal supply circuit 15 includes NOR circuits 3011 to 30N1 and NAND circuits 2012 to 20N2. The NOR circuits 3011 to 30N1 are provided corresponding to the NOR circuits 2011 to 20N1, and NAND circuits 3012 to 30N2 are provided corresponding to the NAND circuits 2012 to 20N2.

A signal REF-P on a positive side and a signal REF-N on a negative side of the reference signal REF that are in a differential relationship are supplied from a signal line 3-1 and a signal line 3-2. The signal line 3-1 is connected to one input terminal of each of the NAND circuits 3012 to 30N2, and the signal line 3-2 is connected to one input terminal of each of the NOR circuits 3011 to 30N1.

The selection signal supply circuit 20 is supplied with the signal REF-P. In response to the leading timing of the signal REF-P, the selection signal supply circuit 20 outputs the selection signals SEL-1 to SEL-N one of which has a logic level "1." The selection signals SEL-1 to SEL-N are supplied to the other input terminals of the NOR circuits 3011 to 30N1 via inverter circuits 3013 to 30N3, respectively, and are also supplied to the other input terminals of the NAND circuits 3012 to 30N2.

When the selection signals SEL-1 to SEL-N are at the logic level "1", signals corresponding to the logic level "1"

of the signal REF-P are output from the corresponding NAND circuits 2012 to 20N2. That is, one of the NAND circuits 2012 to 20N2 among the delay elements 201 to 20N that supplies the signal REF-P is randomly selected according to the selection signals SEL-1 to SEL-N.

In response to the timings of the edges of the output signals of the NAND circuits 2012 to 20N2, the D-type latch circuits 101 to 10N latch the clock signal DCO_CLK supplied from the signal line 2 and supply the latched clock signal to the TDC decoder 10.

The delay elements 201 to 20N of the present embodiment are constituted by the NOR circuits 2011 to 20N1 and the NAND circuits 2012 to 20N2. Therefore, the delay time can be shortened and the resolution of the TDC circuit 1 can be increased as compared with a case where the delay elements 201 to 20N are constituted by the OR circuits, that is, the NOR circuits and the inverter circuits.

Figure 5:
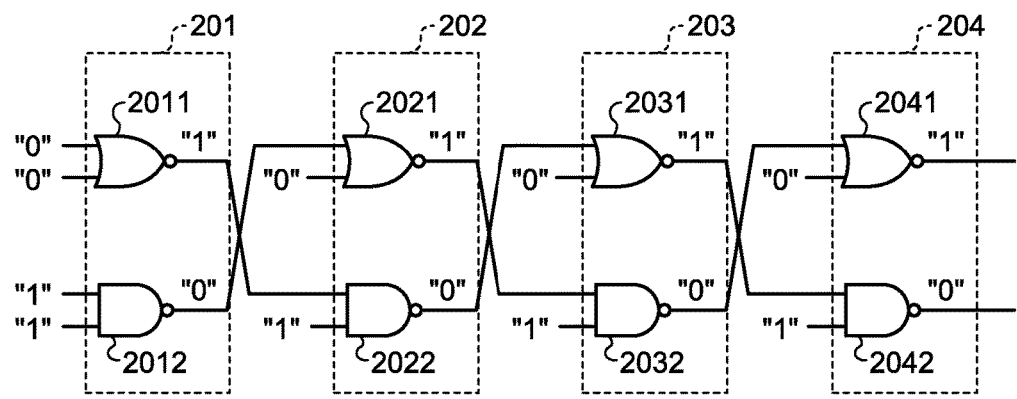
FIG. 5 is a diagram for describing the operation of the delay element of the TDC circuit of the second embodiment.

FIG. 5 is a diagram for describing the operation of the delay elements 201 to 20N of the second embodiment. For convenience, components corresponding to the delay elements 201 to 204, that is, NOR circuits 2011 to 2041 and NAND circuits 2012 to 2042 are illustrated.

A state is illustrated where a signal of logic level "0" is supplied to one input terminal of each of the NOR circuits 2011 to 2041, and a signal of logic level "1" is supplied to one input terminal of each of the NAND circuits 2012 to 2042. For example, in such a state, the ground potential VSS corresponding to the logic level "0" is applied to one input terminal of the NOR circuit 2011, and the power supply voltage VDD corresponding to the logic level "1" is applied to one input terminal of the NAND circuit 2012.

It is understood that the logic levels "0" and "1" of input signals and output signals of the NOR circuits 2011 to 2041 and the NAND circuits 2012 to 2042 operate without failure.

That is, the output signal of the NOR circuit 2011 is supplied to the NAND circuit 2022 of the subsequent stage, and the output signal of the NAND circuit 2012 is supplied to the NOR circuit 2021 of the subsequent stage, that is, in the delay elements of the preceding stage and the subsequent stage, the NOR circuits 2011 to 20N1 and the NAND circuits 2012 to 20N2 are alternately switched and connected. As a result, it is possible to configure a series circuit of a plurality of delay elements 201 to 20N without failure of the logic.

Figure 6:
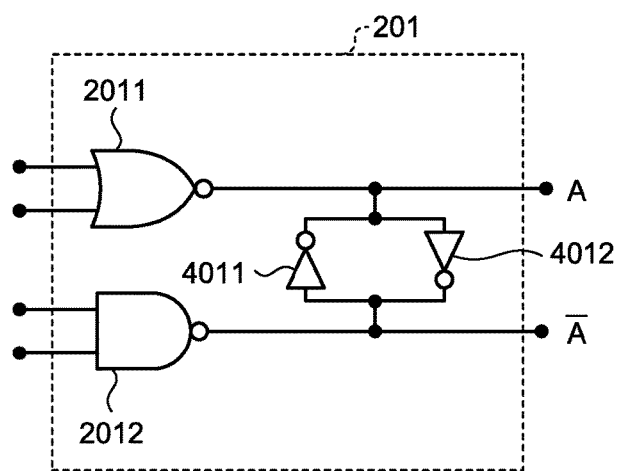
FIG. 6 is a diagram illustrating another configuration of the delay element.

FIG. 6 is a diagram illustrating another configuration of the delay elements 201 to 20N. On behalf of the delay elements, the delay element 201 is illustrated. The delay element 201 includes a NOR circuit 2011, a NAND circuit 2012, and inverter circuits 4011 and 4012.

The inverter circuits 4011 and 4012 are connected in antiparallel between the output terminals of the NOR circuit 2011 and the NAND circuit 2012. The inverter circuit 4011 inverts an output signal /A of the NAND circuit 2012 and supplies the inverted output signal to an output terminal of the NOR circuit 2011. The inverter circuit 4012 inverts an output signal A of the NOR circuit 2011 and supplies the inverted output signal to the output terminal of the NAND circuit 2012.

Figure 7:
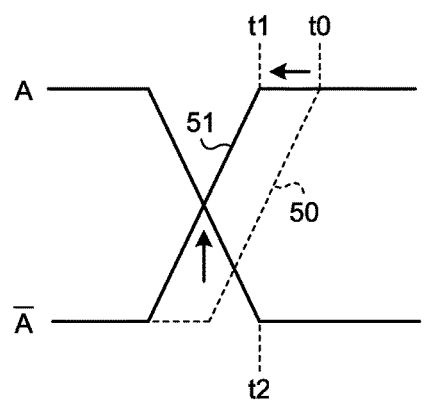
FIG. 7 is a diagram for describing an operation of the delay element in FIG. 6.

FIG. 7 is a diagram for describing an operation of the delay element 201 in FIG. 6. A transition state of the output signal A of the NOR circuit 2011 and the output signal /A of the NAND circuit 2012 are illustrated. The signal A is in an inverted-phase relationship with the signal /A.

For example, when the output signal /A of the NAND circuit 2012 makes a transition from the L level to the H level, it is affected by the output signal A of the NOR circuit 2011. That is, the inverter circuit 4012 inverts the output signal A and supplies the inverted output signal to the output terminal of the NAND circuit 2012. For this reason, the output signal /A is raised from a state indicated by a broken line 50 to a transition state indicated by a solid line 51. The timing at which the output signal /A of the NAND circuit 2012 becomes H level is shifted from t0 to t1.

As a result, a timing t2 at which the output signal A becomes L level coincides with the timing t1 at which the output signal /A becomes H level. Therefore, even when the delay elements 201 to 20N are configured as illustrated in FIG. 6, the delay time in the NOR circuits 2011 to 20N1 can be made equal to the delay time in the NAND circuits 2012 to 20N2. By using the NOR circuits 2011 to 20N1 and the NAND circuits 2012 to 20N2, the delay time per one stage of the delay elements 201 to 20N can be shortened, and the resolution of the TDC circuit 1 can be increased.

Third Embodiment

Figure 8:
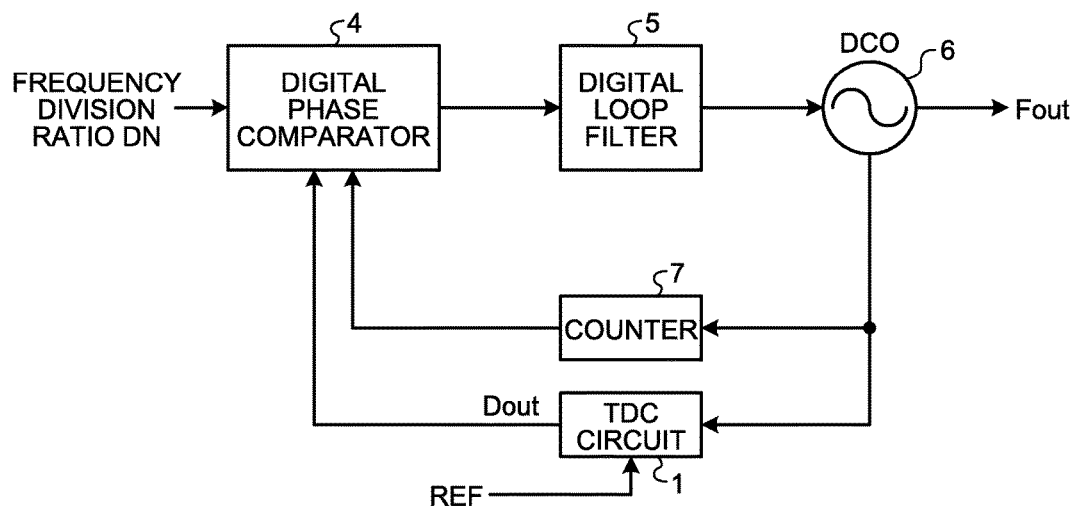
FIG. 8 is a diagram illustrating a configuration of a PLL circuit of a third embodiment.

FIG. 8 is a diagram illustrating a configuration of a PLL circuit of the third embodiment. The present embodiment includes a TDC circuit 1, a digital phase comparator 4, a digital loop filter 5, a DCO 6, and a counter 7. The TDC circuit 1 is constituted by the TDC circuit 1 of any one of the above-described embodiments. The digital code signal Dout of the TDC circuit 1 is supplied to the digital phase comparator 4.

The counter 7 is supplied with an output signal Fout of the DCO 6, counts the number of cycles of the output signal Fout, and calculates and outputs an integer phase.

The digital phase comparator 4 generates a digital signal representing a phase error of the output signal Fout from the integer phase output from the counter 7, the output signal Dout of the TDC circuit 1, and a frequency control signal DN indicating a frequency division ratio. The digital loop filter 5 removes harmonic components and noise included in a digital signal of the digital phase comparator 4, and generates a control signal for controlling a frequency of the output signal Fout.

As described above, since it is possible to randomize the periodicity caused by the nonlinearity of the delay time of the delay elements 201 to 20N by randomly selecting the delay elements 201 to 20N for supplying the reference signal REF in the TDC circuit 1, the spurious of the output signal Fout is suppressed. In addition, since the error caused by randomly selecting the delay elements 201 to 20N is corrected in the TDC circuit 1, no calibration is necessary.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A time to digital converter (TDC) circuit comprising:
   a plurality of delay elements connected in series;
   a reference signal supply circuit that randomly selects one of the plurality of delay elements to supply a reference signal;
   a plurality of latch circuits that latch a clock signal in response to outputs of the plurality of delay elements; and an output circuit that codes output signals output from the plurality of latch circuits and outputs a digital code indicating a relative time relationship of the clock signal with respect to the reference signal.

2. The TDC circuit according to claim 1, wherein the reference signal supply circuit includes:
a random number generation circuit; and
a signal generation circuit that generates a selection signal based on an output of the random number generation circuit, and
the reference signal supply circuit, in response to the selection signal, randomly selects one of the plurality of delay elements to supply the reference signal.

3. The TDC circuit according to claim 2, wherein the reference signal supply circuit includes a signal output circuit that outputs one signal corresponding to an output signal of the random number generation circuit as a logic level "1".

4. The TDC circuit according to claim 3, wherein the reference signal supply circuit includes an AND circuit having one input terminal to which the reference signal is supplied and the other input terminal to which the output signal of the signal generation circuit is supplied.

5. The TDC circuit according to claim 1, wherein the plurality of delay elements include OR circuits.

6. The TDC circuit according to claim 5, wherein a fixed potential of logic level "0" is applied to one input terminal of at least one OR circuit.

7. The TDC circuit according to claim 2, wherein each of the delay elements includes a NAND circuit and a NOR circuit, an output of the NAND circuit of the preceding stage is supplied to the NOR circuit of the subsequent stage, and an output of the NOR circuit of the preceding stage is supplied to the NAND circuit of the subsequent stage.

8. The TDC circuit according to claim 7, wherein the reference signal supply circuit includes a NAND circuit that supplies the reference signal to one input terminal of the NAND circuit of the delay element in response to the selection signal.

9. The TDC circuit according to claim 7, wherein a fixed potential of logic level "0" is applied to one input terminal of the NOR circuit of at least one delay element, and a fixed potential of logic level "1" is applied to one input terminal of the NAND circuit of the at least one delay element.

10. The TDC circuit according to claim 7, comprising a first inverter circuit and a second inverter circuit connected in antiparallel between an output terminal of the NAND circuit and an output terminal of the NOR circuit, the NAND circuit and the NOR circuit constituting the delay element.

11. A phase locked loop (PLL) circuit comprising:
an oscillator in which an oscillation frequency is controlled by a control signal;
a counter that counts an output signal of the oscillator;
a time to digital converter (TDC) circuit to which the output signal of the oscillator is supplied;
a phase comparator that generates a signal indicating a phase error of an output signal of the oscillator based on an output signal of the TDC circuit, an output signal of the counter, and a frequency control signal; and
a loop filter that outputs the control signal in accordance with an output signal of the phase comparator,
wherein the TDC circuit includes:
a plurality of delay elements connected in series;
a reference signal supply circuit that randomly selects one of the plurality of delay elements to supply a reference signal;
a plurality of latch circuits that latch the output signal of the oscillator in response to outputs of the plurality of delay elements; and
an output circuit that codes output signals output from the plurality of latch circuits and outputs a digital code indicating a relative time relationship of the output signal of the oscillator with respect to the reference signal.

12. The PLL circuit according to claim 11, wherein the reference signal supply circuit includes:
a random number generation circuit; and
a signal generation circuit that generates a selection signal based on an output of the random number generation circuit, and
the reference signal supply circuit, in response to the selection signal, randomly selects one of the plurality of delay elements to supply the reference signal.

13. The PLL circuit according to claim 12, wherein the reference signal supply circuit includes a signal output circuit that outputs one signal corresponding to an output signal of the random number generation circuit as a logic level "1".

14. The PLL circuit according to claim 13, wherein the reference signal supply circuit includes an AND circuit having one input terminal to which the reference signal is supplied and the other input terminal to which the output signal of the signal generation circuit is supplied.

15. The PLL circuit according to claim 11, wherein the plurality of delay elements include OR circuits.

16. The PLL circuit according to claim 15, wherein a fixed potential of logic level "0" is applied to one input terminal of at least one OR circuit.

17. The PLL circuit according to claim 11, wherein each of the delay elements includes a NAND circuit and a NOR circuit, an output of the NAND circuit of the preceding stage is supplied to the NOR circuit of the subsequent stage, and an output of the NOR circuit of the preceding stage is supplied to the NAND circuit of the subsequent stage.

18. The PLL circuit according to claim 17, wherein the reference signal supply circuit includes a NAND circuit that supplies the reference signal to one input terminal of the NAND circuit of the delay element in response to the selection signal.

19. The PLL circuit according to claim 17, wherein a fixed potential of logic level "0" is applied to one input terminal of the NOR circuit of at least one delay element, and a fixed potential of logic level "1" is applied to one input terminal of the NAND circuit of the at least one delay element.

20. The PLL circuit according to claim 17, comprising a first inverter circuit and a second inverter circuit connected in antiparallel between an output terminal of the NAND circuit and an output terminal of the NOR circuit, the NAND circuit and the NOR circuit constituting the delay element.

* * * * *